(12) United States Patent
Kado et al.

(10) Patent No.: US 12,707,600 B2
(45) Date of Patent: Aug. 11, 2026

(54) ELECTRIC COMPONENT MODULE

(71) Applicant: Mitsubishi Electric Corporation, Tokyo (JP)

(72) Inventors: Ryosuke Kado, Tokyo (JP); Keiichiro Shizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 265 days.

(21) Appl. No.: 18/719,477

(22) PCT Filed: Feb. 16, 2022

(86) PCT No.: PCT/JP2022/006196
§ 371 (c)(1),
(2) Date: Jun. 13, 2024

(87) PCT Pub. No.: WO2023/157130
PCT Pub. Date: Aug. 24, 2023

(65) Prior Publication Data

US 2025/0056766 A1 Feb. 13, 2025

(51) Int. Cl.
*H05K 7/20* (2006.01)

(52) U.S. Cl.
CPC .................................. *H05K 7/2039* (2013.01)

(58) Field of Classification Search
CPC .................................................... H05K 7/2039
See application file for complete search history.

(56) References Cited

U.S. PATENT DOCUMENTS 5,923,084 A * 7/1999 Inoue .................. H10W 74/114 257/E23.125
6,816,377 B2 * 11/2004 Itabashi ............. H05K 7/20854 361/690

(Continued)

FOREIGN PATENT DOCUMENTS

JP S51-124844 U 10/1976
JP H02-172263 A 7/1990

(Continued)

OTHER PUBLICATIONS

International Search Report of the International Searching Authority mailed Apr. 26, 2022 in corresponding International Application No. PCT/JP2022/006196 (and English translation).

(Continued)

*Primary Examiner* — Mukundbhai G Patel
(74) *Attorney, Agent, or Firm* — POSZ LAW GROUP, PLC

(57) ABSTRACT

An electric component module includes a substrate including a first metal foil provided on a first surface, and a second metal foil provided on a second surface and in which a via hole that penetrates from the first surface to the second surface and electrically connects the first metal foil and the second metal foil is provided, a heat generating component disposed away from the substrate, a heat transfer resin that has contact with the substrate and the heat generating component, a metal member that is disposed on an opposite side of the heat generating component with the substrate therebetween and disposed away from the substrate, a heat dissipation member that has contact with the substrate and the metal member, and a heat transfer pin to be inserted into the via hole. A part of the heat transfer pin has contact with the heat transfer resin.

16 Claims, 3 Drawing Sheets

(56) References Cited

U.S. PATENT DOCUMENTS

| | | | | |
|---|---|---|---|---|
| 8,184,438 | B2 * | 5/2012 | Kaneko | H05K 7/026 361/728 |
| 2011/0279978 | A1 | 11/2011 | Yoshikawa et al. | |
| 2015/0289410 | A1 | 10/2015 | Salat et al. | |
| 2019/0126972 | A1 | 5/2019 | Okamura et al. | |
| 2019/0141853 | A1 | 5/2019 | Fertig et al. | |
| 2020/0168390 | A1 | 5/2020 | Suzuki | |

FOREIGN PATENT DOCUMENTS

| | | | |
|---|---|---|---|
| JP | H09-283664 | A | 10/1997 |
| JP | H11-330747 | A | 11/1999 |
| JP | 2008-160962 | A | 7/2008 |
| JP | 2012-119401 | A | 6/2012 |
| JP | 2015-502054 | A | 1/2015 |
| JP | 2016-152234 | A | 8/2016 |
| JP | 2018-152408 | A | 9/2018 |
| JP | 2019-080471 | A | 5/2019 |
| JP | 2019-087728 | A | 6/2019 |
| JP | 2020-088127 | A | 6/2020 |
| WO | 2010/084717 | A1 | 7/2010 |

OTHER PUBLICATIONS

Office Action dated Jan. 21, 2025 issued for the corresponding Japanese Patent Application No. 2024-500772 (and English translation).

* cited by examiner

ELECTRIC COMPONENT MODULE

CROSS REFERENCE TO RELATED APPLICATION

This application is a U.S. national stage application of PCT/JP2022/006196 filed on Feb. 16, 2022, the contents of which are incorporated herein by reference.

FIELD

The present disclosure relates to an electric component module including a heat generating component.

BACKGROUND

Typically, heat generating components that generate heat such as a coil or a capacitor are installed on an electric component module. Therefore, the electric component module needs means for dissipating the heat generated from the heat generating component.

For example, Patent Literature 1 discloses an electric component module in which an electric component is disposed away from a substrate on one end of the substrate in a plate thickness direction, a metal member is disposed away from the substrate on another end of the substrate in the plate thickness direction, and in addition, a heat dissipation member is disposed to be sandwiched between the substrate and the metal member.

The electric component disclosed in Patent Literature 1 includes a coil that is a heat generating component, a core portion that houses the coil, and a heat transfer resin sandwiched between the core portion and the substrate. According to the technique disclosed in Patent Literature 1, heat generated from the coil can be transferred to the heat transfer resin, the substrate, the heat dissipation member, and the metal member in this order and can be dissipated from the metal member. As a result, the coil can be cooled.

CITATION LIST

Patent Literature

Patent Literature 1: Japanese Patent Application Laid-open No. 2020-088127

SUMMARY OF INVENTION

Problem to be Solved by the Invention

In order to promote cooling of the coil, higher heat transfer efficiency from the coil to the metal member is more desirable. According to the technique disclosed in Patent Literature 1, the heat generated from the coil is transferred to the substrate or the like only through the heat transfer resin. Therefore, a possibility remains that it is possible to increase the heat transfer efficiency from the coil to the metal member.

The present disclosure has been made in view of the above, and an object of the present disclosure is to obtain an electric component module that can increase heat transfer efficiency from a heat generating component to a metal member than in the past.

Means to Solve the Problem

In order to solve the above problems and to achieve the object, an electric component module according to the present disclosure includes a substrate that includes a first surface, a second surface facing an opposite side of the first surface, a first metal foil provided on the first surface, and a second metal foil provided on the second surface, in which a via hole that penetrates from the first surface to the second surface and electrically connects the first metal foil and the second metal foil is provided. Furthermore, the electric component module includes a heat generating component that is disposed away from the substrate in a plate thickness direction of the substrate and a heat transfer resin that is disposed between the substrate and the heat generating component and has contact with the substrate and the heat generating component. Furthermore, the electric component module includes a metal member that is disposed on an opposite side of the heat generating component with the substrate therebetween and disposed away from the substrate in the plate thickness direction of the substrate, a heat dissipation member that is disposed between the substrate and the metal member and has contact with the substrate and the metal member, and a metal heat transfer pin to be inserted into the via hole. A part of the heat transfer pin has contact with the heat transfer resin.

Effects of the Invention

An electric component module according to the present disclosure achieves an effect that it is possible to increase heat transfer efficiency from a heat generating component to a metal member than in the past.

DESCRIPTION OF EMBODIMENTS

Hereinafter, an electric component module according to embodiments will be described in detail with reference to the drawings.

First Embodiment

Figure 1:
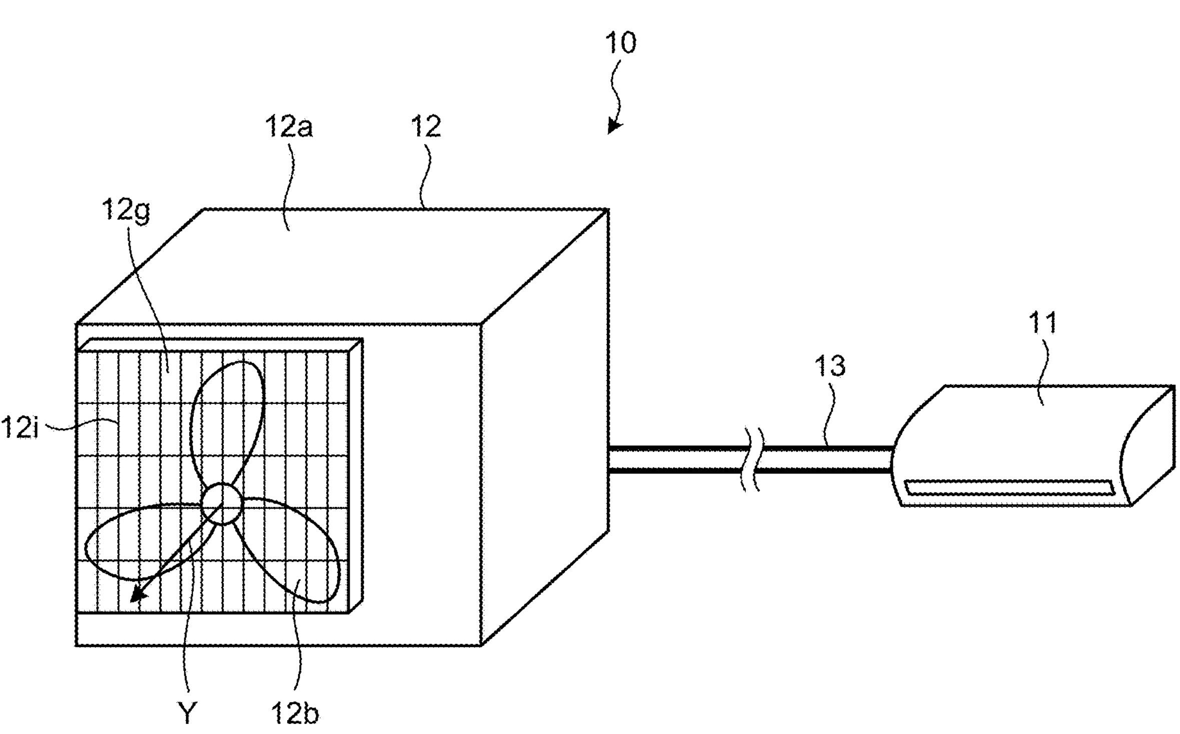
FIG. 1 is a perspective view schematically illustrating an appearance of an air conditioning device according to a first embodiment.
Figure 2:
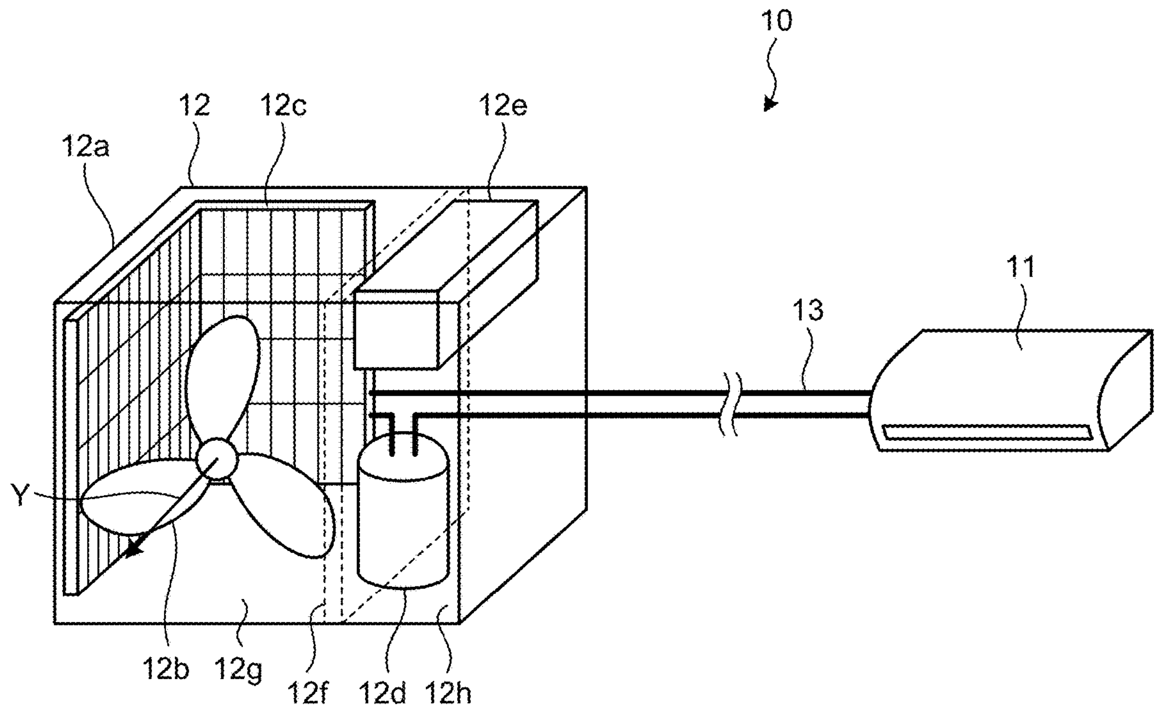
FIG. 2 is a perspective view schematically illustrating an internal structure of the air conditioning device according to the first embodiment.

FIG. 1 is a perspective view schematically illustrating an appearance of an air conditioning device 10 according to a first embodiment. FIG. 2 is a perspective view schematically illustrating an internal structure of the air conditioning device 10 according to the first embodiment. As illustrated in FIG. 1, the air conditioning device 10 includes an indoor unit 11 installed indoors and an outdoor unit 12 installed outdoors. The indoor unit 11 blows conditioned air into a room. The indoor unit 11 and the outdoor unit 12 are connected via a refrigerant pipe 13 that circulates a refrigerant. Although not specifically illustrated, the refrigerant pipe 13 is connected to a valve device such as a four-way valve that switches a refrigerant flow direction or an expansion valve that expands the refrigerant to a predetermined pressure.

As illustrated in FIG. 2, the outdoor unit 12 includes a sheet-metal housing 12*a*, an outdoor fan 12*b*, an outdoor heat exchanger 12*c*, a compressor 12*d*, and a driving device 12*e*. An arrow Y illustrated in FIGS. 1 and 2 indicates a blowing direction of an air flow generated by the outdoor fan 12*b*. In the present embodiment, a side of the outdoor unit 12 where the air flow generated by the outdoor fan 12*b* is discharged to the outside is set as a front side, and an opposite side of the front side is set as a back side.

The sheet-metal housing 12*a* is a box-like member serving as an outline of the outdoor unit 12. A material of the sheet-metal housing 12*a* is metal. The sheet-metal housing 12*a* includes a separator 12*f*. The separator 12*f* divides an inside of the sheet-metal housing 12*a* into a fan chamber 12*g* and a machine chamber 12*h*. The fan chamber 12*g* and the machine chamber 12*h* are formed side by side in a width direction of the outdoor unit 12.

In the fan chamber 12*g*, the outdoor fan 12*b* and the outdoor heat exchanger 12*c* are disposed. The outdoor fan 12*b* is a device that generates an air flow. The outdoor heat exchanger 12*c* is a member for exchanging heat between the refrigerant and outdoor air. Outdoor air to be taken into the outdoor fan 12*b* passes through the outdoor heat exchanger 12*c*. As illustrated in FIG. 1, in a portion, facing the fan chamber 12*g*, in a front side wall of the sheet-metal housing 12*a*, a wire grille 12*i* is provided. In a portion, facing the fan chamber 12*g*, in a back side wall of the sheet-metal housing 12*a*, an air supply port (not illustrated) is provided. When the outdoor fan 12*b* illustrated in FIGS. 1 and 2 is driven, outside air of the outdoor unit 12 flows from the air supply port into the fan chamber 12*g*, and passes through the outdoor heat exchanger 12*c*, and then, is discharged to the outside of the fan chamber 12*g* from the wire grille 12*i*.

As illustrated in FIG. 2, in the machine chamber 12*h*, the compressor 12*d* and the driving device 12*e* are disposed. The compressor 12*d* is a device that compresses the refrigerant using a motor (not illustrated) as a driving source. The driving device 12*e* is a device that receives power from an external power supply (not illustrated) and outputs power to the motor. The driving device 12*e* is provided on a surface, facing the machine chamber 12*h*, of the separator 12*f*.

Figure 3:
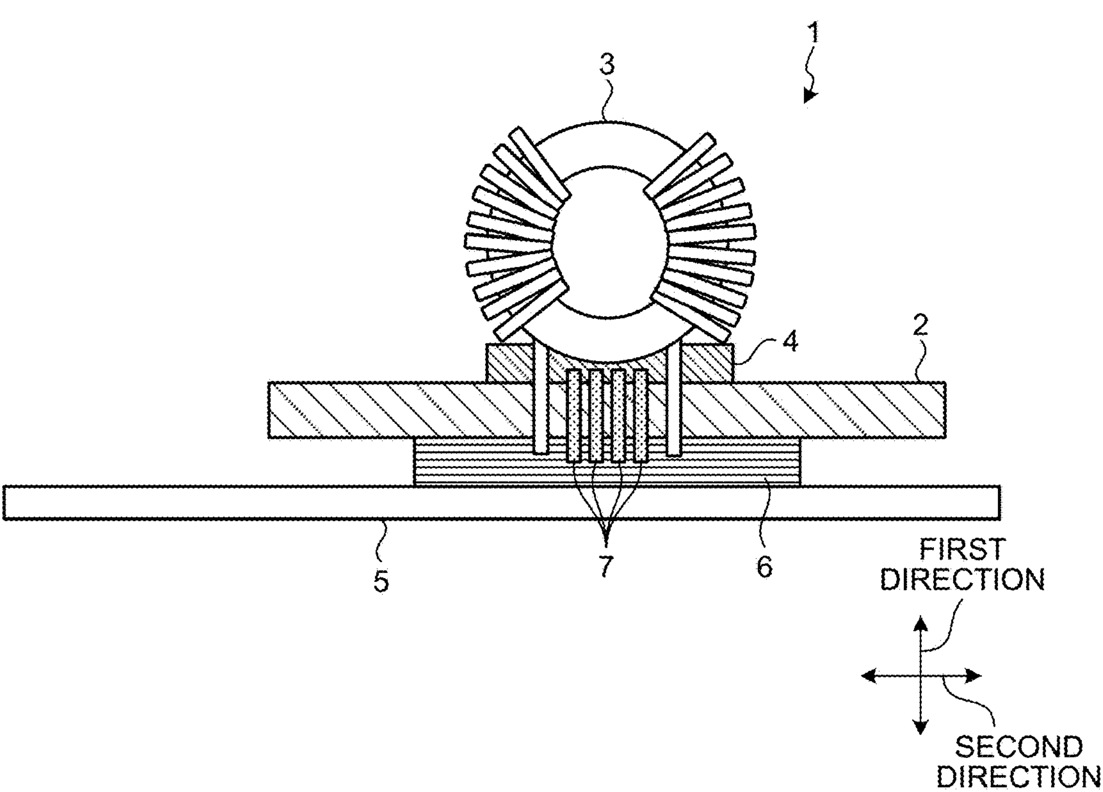
FIG. 3 is a cross-sectional view illustrating an electric component module according to the first embodiment.

FIG. 3 is a cross-sectional view illustrating an electric component module 1 according to the first embodiment. In the driving device 12*e*, the electric component module 1 illustrated in FIG. 3 is installed. The electric component module 1 includes a substrate 2, a coil 3, a heat transfer resin 4, a metal member 5, a heat dissipation member 6, and a plurality of heat transfer pins 7. Hereinafter, when a direction of each component of the electric component module 1 is described, a plate thickness direction of the substrate 2 is set as a first direction, and a direction intersecting with the first direction is set as a second direction. Furthermore, in the following description, a direction from an end portion of the substrate 2 in the second direction toward a center of the substrate 2 in the second direction is set as an inner side, and an opposite side of the inner side is set as an outer side.

Figure 4:
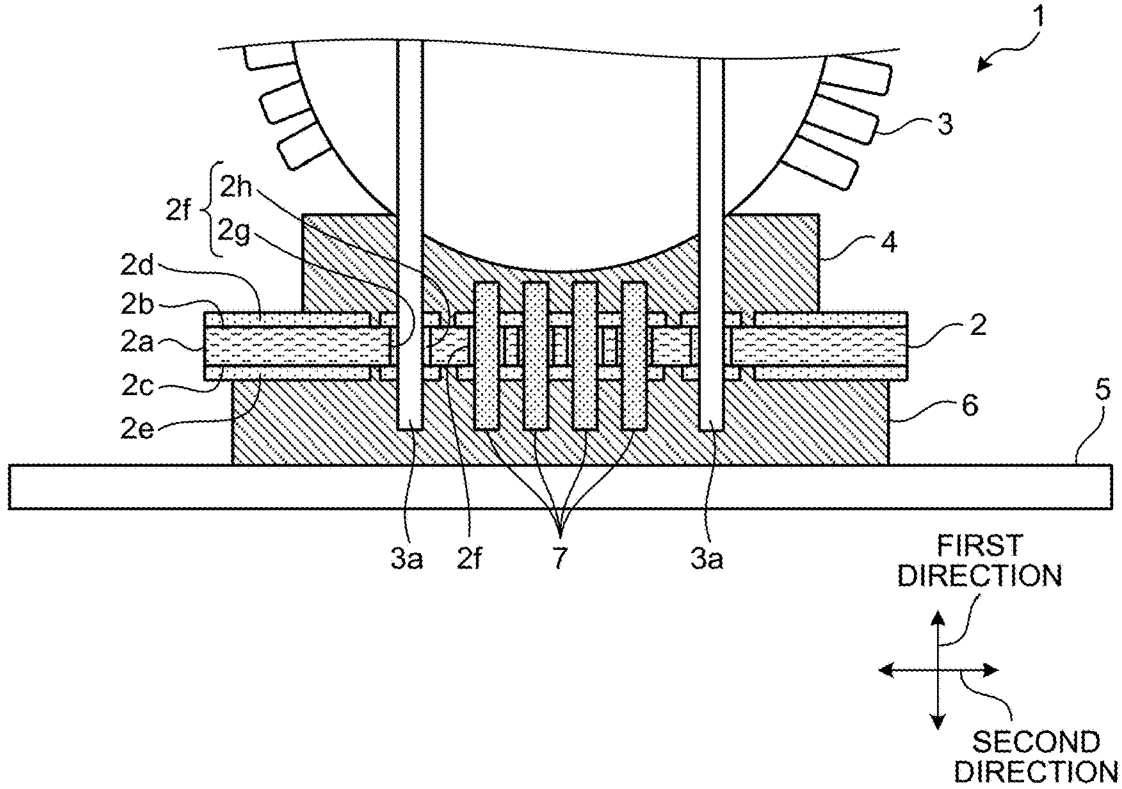
FIG. 4 is a cross-sectional view illustrating details of the electric component module according to the first embodiment.

FIG. 4 is a cross-sectional view illustrating details of the electric component module 1 according to the first embodiment. The substrate 2 is a flat-plate-like member including a conductor portion. The substrate 2 includes a base material 2*a*, a first metal foil 2*d*, and a second metal foil 2*e*. Furthermore, a via hole 2*f* is provided in the substrate 2.

A cross-sectional shape of the base material 2*a* is a rectangle that is longer in the second direction than the first direction. As a material of the base material 2*a*, an insulating resin is used. The base material 2*a* includes a first surface 2*b* and a second surface 2*c* facing an opposite side of the first surface 2*b*.

The first metal foil 2*d* is provided on the first surface 2*b* of the base material 2*a*. The first metal foil 2*d* is partially bonded to the first surface 2*b* of the base material 2*a*. The second metal foil 2*e* is provided on the second surface 2*c* of the base material 2*a*. The second metal foil 2*e* is partially bonded to the second surface 2*c* of the base material 2*a*. In the present embodiment, copper is used as materials of the first metal foil 2*d* and the second metal foil 2*e*. However, for example, copper alloys, aluminum, aluminum alloys, nickel, and nickel alloys may be used.

The via hole 2*f* penetrates from the first surface 2*b* to the second surface 2*c* and electrically connects the first metal foil 2*d* and the second metal foil 2*e*. The via hole 2*f* includes a hole 2*g* that penetrates from the first surface 2*b* of the base material 2*a* to the second surface 2*c* in the first direction and a conductor layer 2*h* that covers an inner wall of the hole 2*g*. The conductor layer 2*h* is formed in a tubular shape. The conductor layer 2*h* is formed by plating. The conductor layer 2*h* electrically connects the first metal foil 2*d* and the second metal foil 2*e*. The conductor portion of the substrate 2 is the first metal foil 2*d*, the second metal foil 2*e*, and the conductor layer 2*h* of the via hole 2*f*.

Electronic components (not illustrated) are mounted on the substrate 2. The electronic components include, for example, a noise filter, a smoothing capacitor, sensors that detect a current and a voltage, a microcomputer, and a peripheral circuit of the microcomputer. The electronic component is bonded to the first metal foil 2*d*, the second metal foil 2*e*, or the via hole 2*f* by soldering.

The coil 3 is a heat generating component disposed away from the substrate 2 in the first direction. When the driving device 12*e* is driven, heat is generated from the coil 3. The coil 3 includes two lead wires 3*a* extending toward the substrate 2. The two lead wires 3*a* are separated from each other in the second direction.

The heat transfer resin 4 is a member that is disposed between the substrate 2 and the coil 3 and has contact with the substrate 2 and the coil 3. The heat transfer resin 4 plays a role for transferring the heat generated from the coil 3 to the heat transfer pin 7 and the substrate 2. It is preferable that a resin with a high heat conductivity be used as the heat transfer resin 4. The heat transfer resin 4 is sandwiched between the substrate 2 and the coil 3. The heat transfer resin 4 is thermally coupled to the first metal foil 2*d* and the coil 3. A part of the heat transfer resin 4 passes through the first metal foil 2*d* in the first direction and has contact with the first surface 2*b*.

The metal member 5 is a member that is disposed on an opposite side of the coil 3 with the base material 2*a* therebetween and is disposed away from the substrate 2 in the first direction. The metal member 5 has a conductivity and heat dissipation. The metal member 5 plays a role for dissipating the heat generated from the coil 3 to outside of the driving device 12*e*. In the present embodiment, the metal member 5 is a sheet metal. However, the metal member 5 may be a heat sink, a housing configuring an outline of a device on which the driving device 12*e* is installed, or the like. In a case where the driving device 12*e* is installed on the air conditioning device 10, the metal member 5 may be the sheet-metal housing 12*a* of the outdoor unit 12.

The heat dissipation member 6 is a member that is disposed between the substrate 2 and the metal member 5 and has contact with the substrate 2 and the metal member 5. The heat dissipation member 6 plays a role for dissipating the heat generated from the coil 3. As the heat dissipation member 6, a heat dissipation sheet, gel, or gel having heat dissipation is used. The heat dissipation member 6 is sandwiched between the substrate 2 and the metal member 5. The heat dissipation member 6 is thermally coupled to the second metal foil 2*e* and the metal member 5. A part of the heat dissipation member 6 passes through the second metal foil 2*e* in the first direction and has contact with the second surface 2*c*.

The heat transfer pin 7 is a metal member inserted into the via hole 2*f*. It is preferable that metal with a high heat conductivity be used as the heat transfer pin 7. The heat transfer pin 7 protrudes toward the heat transfer resin 4 than the first surface 2*b* of the substrate 2 and the first metal foil 2*d*. A part of the heat transfer pin 7 has contact with the heat transfer resin 4. A part of the heat transfer pin 7 enters the heat transfer resin 4. The heat transfer pin 7 protrudes toward the heat dissipation member 6 than the second surface 2*c* of the substrate 2 and the second metal foil 2*e*. A part of the heat transfer pin 7 has contact with the heat dissipation member 6. A part of the heat transfer pin 7 enters the heat dissipation member 6. The heat transfer pin 7 passes through the via hole 2*f* from the heat transfer resin 4 and reaches the heat dissipation member 6.

Although the number of heat transfer pins 7 is not particularly limited, the number is four in the present embodiment. The four heat transfer pins 7 are arranged at intervals in the second direction. The single heat transfer pin 7 is inserted into the single via hole 2*f*. The heat transfer pin 7 is disposed at a position overlapping the coil 3 in the first direction. The heat transfer pin 7 is disposed at a position closer to the center of the coil 3 in the second direction. The heat transfer pin 7 is disposed between the two lead wires 3*a* in the second direction. The heat transfer pin 7 is disposed on an inner side of each lead wire 3*a*.

Hereinafter, effects of the electric component module 1 according to the first embodiment will be described.

In the present embodiment, as illustrated in FIG. 4, the electric component module 1 includes the coil 3 disposed away from the substrate 2 in the plate thickness direction of the substrate 2 and the heat transfer resin 4 that is disposed between the substrate 2 and the coil 3 and has contact with the substrate 2 and the coil 3. Furthermore, the electric component module 1 includes the metal member 5 that is disposed on the opposite side of the coil 3 with the substrate 2 therebetween and is disposed away from the substrate 2 in the plate thickness direction of the substrate 2 and the heat dissipation member 6 that is disposed between the substrate 2 and the metal member 5 and has contact with the substrate 2 and the metal member 5. Furthermore, the electric component module 1 includes the metal heat transfer pin 7 inserted into the via hole 2*f*, and a part of the heat transfer pin 7 has contact with the heat transfer resin 4. Furthermore, a part of the heat transfer pin 7 has contact with the heat dissipation member 6. With these configurations, in the present embodiment, a route is mainly divided into a route in which the heat generated from the coil 3 is transferred to the heat transfer resin 4, the heat transfer pin 7, the heat dissipation member 6, and the metal member 5 in this order and a route in which the heat generated from the coil 3 is transferred to the heat transfer resin 4, the substrate 2, the heat dissipation member 6, and the metal member 5 in order. Then, the heat transferred from each route to the metal member 5 can be dissipated from the metal member 5 to the outside of the driving device 12*e*. Note that the heat transferred from the heat transfer resin 4 to the substrate 2 is transferred to the first metal foil 2*d*, the via hole 2*f*, and the second metal foil 2*e* in this order.

In the present embodiment, the heat generated from the coil 3 is transferred to the substrate 2 through the heat transfer resin 4, and in addition, the heat generated from the coil 3 is transferred to the heat dissipation member 6 through the heat transfer pin 7. Therefore, as compared with a case where the heat generated from the coil 3 is transferred to the substrate 2 only through the heat transfer resin 4, heat transfer efficiency from the coil 3 to the metal member 5 can be increased, and cooling of the coil 3 can be promoted. In particular, in the present embodiment, by connecting the heat transfer resin 4 and the heat dissipation member 6 with the metal heat transfer pin 7, the heat transfer efficiency from the heat transfer resin 4 to the heat dissipation member 6 can be increased.

Furthermore, by increasing the heat transfer efficiency from the coil 3 to the metal member 5, it is possible to reduce a size of the coil 3, and it is possible to reduce an effect of the heat of the coil 3 on peripheral components and reduce an area of the substrate 2.

In the present embodiment, as illustrated in FIG. 4, the heat transfer pin 7 protrudes toward the heat transfer resin 4 than the first surface 2*b* of the substrate 2 and the first metal foil 2*d* so that a surface area of the heat transfer pin 7 that receives heat from the heat transfer resin 4 increases. Therefore, it is possible to efficiently transfer the heat from the heat transfer resin 4 to the heat transfer pin 7, and it is possible to further increase the heat transfer efficiency from the coil 3 to the metal member 5.

In the present embodiment, as illustrated in FIG. 4, the heat transfer pin 7 protrudes toward the heat dissipation member 6 from the second surface 2*c* of the substrate 2 and the second metal foil 2*e* so that the surface area of the heat transfer pin 7 that transfers heat to the heat dissipation member 6 increases. Therefore, it is possible to efficiently transfer the heat from the heat transfer pin 7 to the heat dissipation member 6, and it is possible to further increase the heat transfer efficiency from the coil 3 to the metal member 5.

In the present embodiment, since the heat transfer resin 4 illustrated in FIG. 4 is a resin, the heat transfer resin 4 can be easily deformed. Therefore, the coil 3 having irregularities can be brought into close contact with the heat transfer resin 4, it is possible to efficiently transfer the heat from the coil 3 to the heat transfer resin 4, and it is possible to further increase the heat transfer efficiency from the coil 3 to the metal member 5.

Note that, in the present embodiment, the heat transfer pin 7 is inserted into the via hole 2*f* and is fixed to the heat transfer resin 4 and the heat dissipation member 6. However, the heat transfer pin 7 may be bonded to the substrate 2 by soldering. Since a volume of a metal portion of the heat transfer pin 7 can be increased in this way, it is possible to further increase the heat transfer efficiency from the coil 3 to the metal member 5.

Second Embodiment

Figure 5:
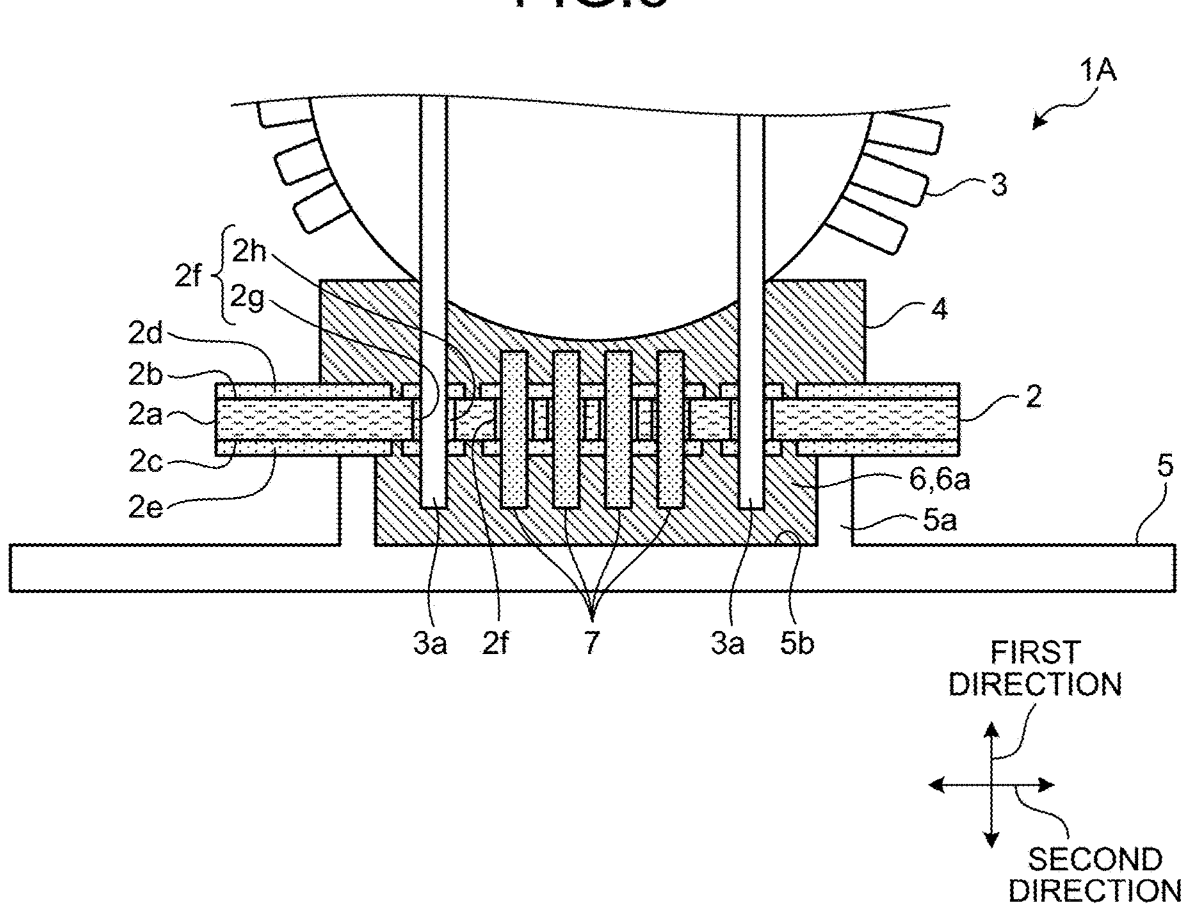
FIG. 5 is a cross-sectional view illustrating details of an electric component module according to a second embodiment.

Next, an electric component module 1A according to a second embodiment will be described with reference to FIG. 5. FIG. 5 is a cross-sectional view illustrating details of the electric component module 1A according to the second embodiment. The present embodiment is different from the first embodiment in that a liquid metal 6*a* is used as the heat dissipation member 6 and a housing portion 5*a* that houses the liquid metal 6*a* is provided in the metal member 5. Note that, in the second embodiment, portions overlapping the first embodiment are denoted with the same reference numerals, and description thereof is omitted.

The annular housing portion 5*a* that protrudes toward the substrate 2 is formed in a portion of the metal member 5 facing the substrate 2. A front end of a wall of the housing portion 5*a* has contact with the second metal foil 2*e* of the substrate 2. A recess 5*b* that opens toward the substrate 2 is formed in the housing portion 5*a*. The liquid metal 6*a* is housed in the recess 5*b*. The liquid metal 6*a* has contact with the second metal foil 2*e*, the heat transfer pin 7, and the lead wire 3*a* of the coil 3. A part of the heat transfer pin 7 and a part of the lead wire 3*a* enter the liquid metal 6*a*.

In the present embodiment, the heat dissipation member 6 is the liquid metal and the metal member 5 includes the housing portion 5*a* that houses the liquid metal 6*a* so that heat transferred from the heat transfer pin 7 to the liquid metal 6*a* causes a convection phenomenon in the liquid metal 6*a*. That is, the heated liquid metal 6*a* transfers the heat to the metal member 5 while causing the convection phenomenon. Therefore, by utilizing characteristics of the liquid metal 6*a* that causes the convection phenomenon as liquid and characteristics of the liquid metal 6*a* having a high heat conductivity as metal, it is possible to efficiently transfer the heat from the heat dissipation member 6 to the metal member 5, and it is possible to further increase the heat transfer efficiency from the coil 3 to the metal member 5.

In the present embodiment, a configuration in which the housing portion 5*a* is formed by protruding a part of the portion of the metal member 5 facing the substrate 2 toward the substrate 2 has been described. However, the present embodiment is not limited to this configuration. For example, the housing portion 5*a* may be formed by recessing a part of the portion of the metal member 5 facing the substrate 2 so as to be away from the substrate 2 in the first direction.

The configurations illustrated in the above embodiments indicate examples and can be combined with other known techniques. Furthermore, the embodiments can be combined with each other, and some configurations can be partially omitted or changed without departing from the scope of the present invention.

In each embodiment described above, a case where the number of heat transfer pins 7 is four is described. However, the number of heat transfer pins 7 may be appropriately increased or decreased. Furthermore, although the heat transfer pins 7 illustrated in FIGS. 3 to 5 are arranged in a horizontal direction of the paper, the heat transfer pins 7 may be arranged in a depth direction of the paper or may be arranged in both of the horizontal direction of the paper and the depth direction of the paper. Furthermore, although the heat transfer pin 7 illustrated in FIGS. 3 to 5 is disposed on the inner side of the lead wire 3*a*, the heat transfer pin 7 may be disposed on the outer side of the lead wire 3*a*. In a case of such a configuration, it is sufficient that the via hole 2*f* be provided in a portion of the substrate 2 positioned on the outer side of the lead wire 3*a* and the heat transfer pin 7 be inserted into the via hole 2*f*.

In each embodiment described above, the heat transfer pin 7 protrudes toward the heat transfer resin 4 than the first metal foil 2*d*. However, the heat transfer pin 7 may have contact with the heat transfer resin 4 without protruding the heat transfer pin 7 toward the heat transfer resin 4 than the first metal foil 2*d*. That is, an end surface of the heat transfer pin 7 facing the heat transfer resin 4 and an end surface of the first metal foil 2*d* facing the heat transfer resin 4 may form the same surface.

Furthermore, in each embodiment described above, the heat transfer pin 7 protrudes toward the heat dissipation member 6 than the second metal foil 2*e*. However, the heat transfer pin 7 may have contact with the heat dissipation member 6 without protruding the heat transfer pin 7 toward the heat dissipation member 6 than the second metal foil 2*e*. That is, an end surface of the heat transfer pin 7 facing the heat dissipation member 6 and an end surface of the second metal foil 2*e* facing the heat transfer resin 4 may form the same surface.

Furthermore, in each embodiment described above, a part of the heat transfer pin 7 has contact with the heat dissipation member 6. However, a part of the heat transfer pin 7 may be separated from the heat dissipation member 6 without making the heat transfer pin 7 have contact with the heat dissipation member 6. In this way, the route is divided into the route in which the heat generated from the coil 3 is transferred to the heat transfer resin 4, the heat transfer pin 7, the substrate 2, the heat dissipation member 6, and the metal member 5 in this order and the route in which the heat generated from the coil 3 is transferred to the heat transfer resin 4, the substrate 2, the heat dissipation member 6, and the metal member 5 in this order. That is, the heat generated from the coil 3 is transferred to the substrate 2 through the heat transfer resin 4, and in addition, the heat generated from the coil 3 is transferred to the substrate 2 through the heat transfer pin 7. Therefore, it is possible to increase the heat transfer efficiency from the coil 3 to the metal member 5 than in the past, and it is possible to promote cooling of the coil 3.

The heat generating component to be cooled is not limited to the coil 3, as long as the heat generating component is an electronic device that generates heat. The heat generating component may be, for example, a capacitor.

REFERENCE SIGNS LIST

1, 1A electric component module; 2 substrate; 2*a* base material; 2*b* first surface; 2*c* second surface; 2*d* first metal foil; 2*e* second metal foil; 2*f* via hole; 2*g* hole; 2*h* conductor layer; 3 coil; 3*a* lead wire; 4 heat transfer resin; 5 metal member; 5*a* housing portion; 5*b* recess; 6 heat dissipation member; 6*a* liquid metal; 7 heat transfer pin; 10 air conditioning device; 11 indoor unit; 12 outdoor unit; 12*a* sheet-metal housing; 12*b* outdoor fan; 12*c* outdoor heat exchanger; 12*d* compressor; 12*e* driving device; 12*f* separator; 12*g* fan chamber; 12*h* machine chamber; 12*i* wire grille; 13 refrigerant pipe.

The invention claimed is:

1. An electric component module comprising:

a substrate to include a first surface, a second surface facing an opposite side of the first surface, a first metal foil provided on the first surface, and a second metal foil provided on the second surface, in which a via hole that penetrates from the first surface to the second surface and electrically connects the first metal foil and the second metal foil is provided;

a heat generating component disposed away from the substrate in a plate thickness direction of the substrate;

a heat transfer resin to be disposed between the substrate and the heat generating component and have contact with the substrate and the heat generating component;

a metal member disposed on an opposite side of the heat generating component with the substrate therebetween and disposed away from the substrate in the plate thickness direction of the substrate;

a heat dissipation member to be disposed between the substrate and the metal member and have contact with the substrate and the metal member; and a metal heat transfer pin to be inserted into the via hole, wherein the first metal foil and the via hole are formed at positions overlapping at least the heat generating component as viewed along the plate thickness direction of the substrate, and a part of the heat transfer pin inserted into the via hole has contact with the heat transfer resin.

2. The electric component module according to claim 1, wherein the heat dissipation member is a liquid metal, and the metal member includes a housing portion that houses the liquid metal.

3. The electric component module according to claim 2, wherein a part of the heat transfer pin has contact with the heat dissipation member.

4. The electric component module according to claim 3, wherein the heat transfer pin is soldered to the substrate.

5. The electric component module according to claim 2, wherein the heat transfer pin is soldered to the substrate.

6. The electric component module according to claim 1, wherein a part of the heat transfer pin has contact with the heat dissipation member.

7. The electric component module according to claim 6, wherein the heat transfer pin is soldered to the substrate.

8. The electric component module according to claim 1, wherein the heat transfer pin is soldered to the substrate.

9. An electric component module comprising:

a substrate to include a first surface, a second surface facing an opposite side of the first surface, a first metal foil provided on the first surface, and a second metal foil provided on the second surface, in which a via hole that penetrates from the first surface to the second surface and electrically connects the first metal foil and the second metal foil is provided;

a heat generating component disposed away from the substrate in a plate thickness direction of the substrate;

a heat transfer resin to be disposed between the substrate and the heat generating component and have contact with the substrate and the heat generating component;

a metal member disposed on an opposite side of the heat generating component with the substrate therebetween and disposed away from the substrate in the plate thickness direction of the substrate;

a heat dissipation member to be disposed between the substrate and the metal member and have contact with the substrate and the metal member; and a metal heat transfer pin to be inserted into the via hole, wherein a part of the heat transfer pin protrudes toward the heat transfer resin than the first surface of the substrate and the first metal foil and has contact with the heat transfer resin.

10. The electric component module according to claim 9, wherein the heat dissipation member is a liquid metal, and the metal member includes a housing portion that houses the liquid metal.

11. The electric component module according to claim 10, wherein a part of the heat transfer pin has contact with the heat dissipation member.

12. The electric component module according to claim 11, wherein the heat transfer pin is soldered to the substrate.

13. The electric component module according to claim 10, wherein the heat transfer pin is soldered to the substrate.

14. The electric component module according to claim 9, wherein a part of the heat transfer pin has contact with the heat dissipation member.

15. The electric component module according to claim 14, wherein the heat transfer pin is soldered to the substrate.

16. The electric component module according to claim 9, wherein the heat transfer pin is soldered to the substrate.

* * * * *